(12) United States Patent
Rodriguez et al.

(10) Patent No.: US 6,704,196 B1
(45) Date of Patent: Mar. 9, 2004

(54) FLOW-THROUGH COOLING IN-THE-ROUND SYSTEM

(75) Inventors: Louis John Rodriguez, San Jose, CA (US); Bryan Joseph Rodriguez, Woodside, CA (US)

(73) Assignee: Allied Systems Design, Inc., Cupertino, CA (US)

( * ) Notice: Subject to any disclaimer, the term of this patent is extended or adjusted under 35 U.S.C. 154(b) by 0 days.

(21) Appl. No.: 10/205,765

(22) Filed: Jul. 25, 2002

(51) Int. Cl.[7] .................................................. H05K 7/20
(52) U.S. Cl. .................. 361/687; 361/727; 165/104.33; 62/259.2
(58) Field of Search .............................. 361/695, 697, 361/685–687, 724–727; 165/104.33, 80.3; 174/52.1, 35 R; 62/259.2

(56) References Cited

U.S. PATENT DOCUMENTS 5,297,005 A * 3/1994 Gourdine .................... 361/697
6,330,152 B1 * 12/2001 Vos et al. .................... 361/688
6,459,577 B1 * 10/2002 Holmes et al. .............. 361/690

* cited by examiner

*Primary Examiner*—Hung Van Duong
(74) *Attorney, Agent, or Firm*—Thomas E. Schatzel; Law Offices of Thomas E. Schatzel, A Prof. Corp.

(57) ABSTRACT

A chassis-rack system mounts two 19" RETMA rack chassis back-to-back in the same vertical 1U-space. Each has an independent cooling system that draws-in cold air from respective front and rear panels. Such panels are provided with a series of slots that are blocked-off in different patterns according to empirical cooling tests, done with particular complements of internal constituent components. Such intakes are typically at a left side of the panel, and air drawn in is forced to flow to the back and around to the right by two floor-to-ceiling partition walls. Such walls can define bay for a CD-ROM, floppy disk, or PCI-bus. The drawn-in air is critically sequenced first over processors, memory, then hard disk drives, and finally over a power supply. The power supply is near the front on the right, typically, and-two 33-CFM fans exhaust the heated air out the respective panels. The chassis enclosures each have a lid with a special flat ductwork that conducts cold outside air directly to at least one CPU fan and heatsink.

11 Claims, 2 Drawing Sheets

US 6,704,196 B1

FLOW-THROUGH COOLING IN-THE-ROUND SYSTEM

FIELD OF THE INVENTION

The present invention relates to methods and devices for cooling rack-mounted equipment, and in one instance to computer-based systems that place tandem, independent system chassis back-to-back where each independently intakes and exhausts cooling air through respective exposed panels.

DESCRIPTION OF THE PRIOR ART

Computer-based network equipment is typically mounted in so-called RETMA equipment racks. Such racks are 19" wide and the vertical spaces are measured in units of 1.75", e.g., "1U". Rack space is typically at a premium, especially in modem farm sites that are rented by the phone companies. So packaging equipment designs into the smallest vertical space can result in tremendous economic savings.

Unfortunately, packaging a computer-based piece of network equipment into a 1U-space works against being able to adequately cool the electronics inside. The large footprint, typically 17" by 28", can be a challenge to force air through when CPU-boards, memories, disk drives, and power supplies are all stuffed into a vertical space only 1.75" high.

In recent years, high-performance Intel and AMD microprocessors have required rather large heatsinks and associated forced-air cooling fans. Many of these CPU-cooling devices need more vertical room than is available in a 1U-space. The ones that will fit in such a confined space need excellent cold-air intake and sufficient air volume movement to keep temperatures under control.

SUMMARY OF THE INVENTION

It is therefore an object of the present invention to provide a method and system for cooling electronic equipment in RETMA-racks.

It is another object of the present invention to provide a tandem equipment chassis that occupies a 17" by 28" footprint and keeps the internal electronics cool in a 1U vertical rack space.

It is a further object of the present invention to provide an equipment chassis that keeps its internal electronics cool in a 1U, 2U, 3U, etc., vertical rack space.

Briefly, a chassis rack system embodiment of the present invention mounts two 19" RETMA rack chassis back-to-back in the same 1U-space. Each has an independent cooling system that draws-in cold air from respective front and rear panels. Such panels are provided with a series of slots that are blocked-off in different patterns according to empirical cooling tests done with particular complements of internal constituent components. Such intakes are typically at one side of the panel, and air drawn in is forced to flow to the back and around to the opposite side by two floor-to-ceiling partition walls. Such walls can be set to different lengths to define a bay for a CD-ROM, floppy disk, PCI-bus, etc., and to tune the circulating airflow. The drawn-in air is critically sequenced first over a processor board, then a memory, then hard disk drives, and finally over a power supply. The power supply is near the front on the right, typically, and two 33-CFM fans exhaust the heated air out the respective panels. The chassis enclosures each have a lid with a special flat ductwork that conducts cold outside air directly to at least one CPU fan, heatsink, or other critical component.

An advantage of the present invention is that a method is provided for cooling rack-mounted electronic equipment.

Another advantage of the present invention is that a system is provided for optimizing cooling airflow through computer-based equipment chassis.

These and other objects and advantages of the present invention will no doubt become obvious to those of ordinary skill in the art after having read the following detailed description of the preferred embodiments which are illustrated in the various drawing figures.

IN THE DRAWINGS

DETAILED DESCRIPTION OF THE PREFERRED EMBODIMENT

Figure 1:
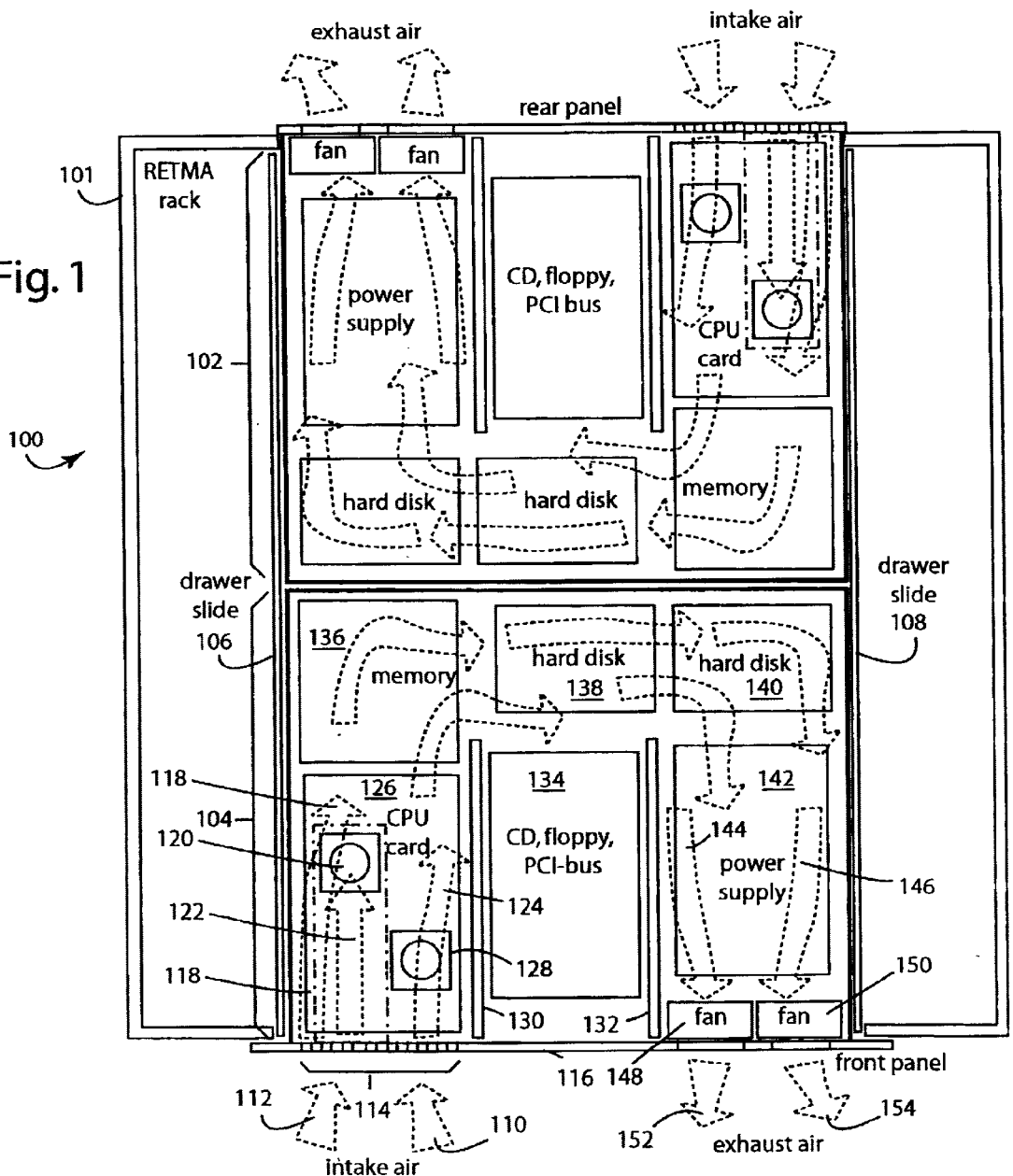
FIG. 1 is a horizontal cross-sectional diagram of a flow-through cooling in-the-round system embodiment of the present invention. Two independent chassis are shown back-to-back into the same vertical 1U-space.

FIG. 1 illustrates a flow-through cooling in-the-round system embodiment of the present invention, and is referred to herein by the general reference numeral 100. The system 100 mounts, for example, inside a standard 19" RETMA-rack 101. A pair of rear and front "1U" high chassis racks 102 and 104 are horizontally bound together by a pair of drawer slides 106 and 108. Each chassis rack 102 and 104 is separately fully enclosed and both have independent forced-air cooling systems. For example, the front chassis rack 104 draws-in intake cool air 110 and 112 through slots 114 in a front panel 116. The intake cool air 112 becomes airflow 118 that is channeled directly to a rear CPU fan and heatsink 120. The intake cool air 110 becomes airflows 122 and 124 that first pass over a processor board 126 that includes a front CPU fan and heatsink 128.

A pair of floor-to-ceiling partitions 130 and 132 direct an airflow back around a bay 134 over a memory 136, hard disks 138 and 140, and then past a power supply 142. The bay 134 provides space for a CD-ROM, floppy, PCI-bus, or other subassembly. The length to which the partitions 130 and 132 extend toward the back is adjusted experimentally to result in good, non-turbulent airflow around the rear components.

The power supply 142 is typically the hottest component inside chassis rack 104, so it very much heats airflows 144 and 146. These are immediately exhausted by fans 148 and 150 into exhaust-air flows 152 and 154.

The internal airflows and construction of chassis rack 102 is very similar to chassis rack 104, but faces the opposite direction. This allows the full horizontal footprint in the vertical 1U-space to be filled by equipment, e.g., network servers and routers. Such footprint is, in one instance, 17" by 28". Each chassis rack 102 and 104 is independent, and one can be opened and serviced while the other is still operating normally.

Figure 2:
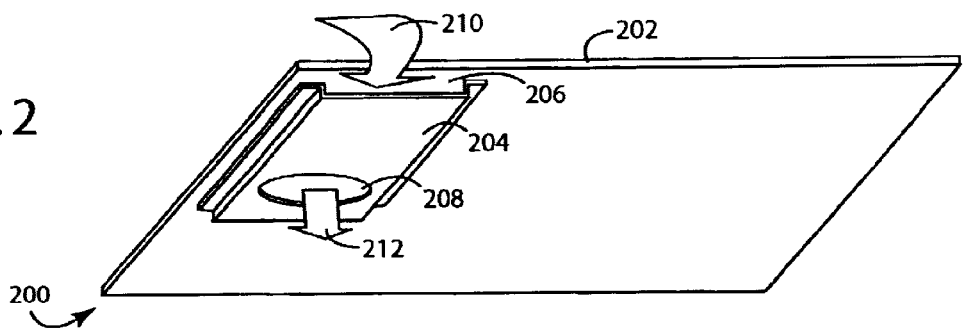
FIG. 2 is a perspective diagram of a chassis lid suitable for use with the chassis enclosures of FIGS. 1 and 3.
Figure 3:
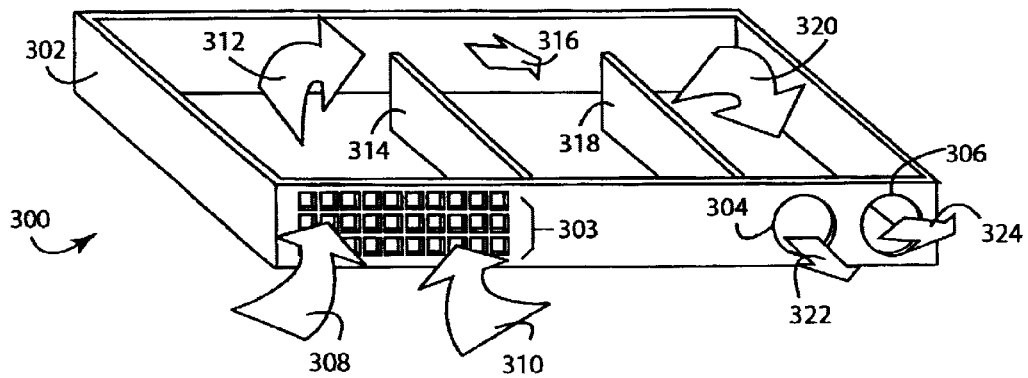
FIG. 3 is a perspective diagram of a chassis enclosure suitable for use with the items shown in FIGS. 1 and 2.

FIGS. 2 and 3 show the preferred details of construction for chassis racks 102 and 104. In FIG. 2, a chassis top assembly 200 includes a flat lid 202 fitted with a ductwork 204. An intake port 206 ducts to an exhaust port 208 that sits immediately above a fan. For example, a fresh-air flow 210 is drawn in, typically in FIG. 1 as airflow 118 by fan 120 through intake slots 114. It exits as airflow 212 directly onto the CPU fan and heatsink 120.

In FIG. 3, a matching chassis 300 has an enclosure 302 with a number of air intake ports 303. A pair of exhaust ports 304 and 306 allow heated heat to escape to the environment. A fresh air inflow 308 is directed into ductwork 204. Another fresh air inflow, 310 flows internally as airflows 312, around a first floor-to-ceiling partition wall 314. A bypass flow 316 continues around back and turns forward past a second floor-to-ceiling partition wall 318. An airflow 320 is exhausted, as airflows 322 and 324.

The sequence of how cooling air visits the internal components is important. The power supply usually runs the hottest, and it should be the last item visited by the in-the-round circulating forced-air before being exhausted out the front panel. The CPU's on the processor boards are very critical, and one of the most expensive components in the whole system. So these are preferably placed close to the front-panel air intakes. The usual Intel and AMD microprocessor CPU-heatsink has fins that are preferably oriented orthogonal to the airflow entering from the front panel intake slots. A small fan is customarily mounted atop such heatsinks. In FIGS. 1–3, at least one of these CPU fans and heatsinks receives a cool air intake ducted directly in from the front panel slots through a ductwork fabricated in the chassis lid.

A variable number of the air intake ports 303 are deliberately blocked to improve cooling. Adhesive film tape can be used. Too many, or the wrong ports 303 being opened can result in ineffective airflow and stagnation, which leads to spot overheating. The particular ones and numbers of air intake ports 303 to block-off are empirically arrived at by replacing lid 202 with a clear plastic material. Smoke is then introduced into airflows 308 and 310 and the internal circulation is observed. Various combinations of blockages with film tape are tried on air intake ports 303 until temperature probe measurements confirm optimal and uniform cooling of internal components within chassis 302. Such patterns of blockages can then be repeated in volume manufacturing.

A method embodiment of the present invention for cooling an electronic equipment chassis comprises enclosing several constituent electronic components within a chassis having a closed back apron, closed sides, and closed top and bottom panels. A series of air intake slots are provided in a front panel disposed in the chassis. Air is exhausted out from within the chassis through the front panel. The interior of the chassis is partitioned with a floor-to-ceiling wall that extends back from the from panel oppositely toward the closed back apron. The airflow through the interior of the chassis is tested for turbulence and component-cooling effectivity. The rearward extent of the floor-to-ceiling wall is adjusted according to results obtained in the step of testing. Also, various ones of the series of air intake slots can be blocked and unblocked according to results obtained in the step of testing. The placement of components inside the chassis is preferably done such that airflow arriving inside from the air intake slots visits, in order, a processor board, a memory, a hard disk drive, and lastly a power supply before being forced out in the step of exhausting air.

Another method for cooling a pair of electronic equipment chassis includes enclosing respective constituent electronic components within a pair of chassis each having a closed back apron, closed sides, and closed top and bottom panels. The pair of chassis are arranged back-to-back in the same vertical space of an equipment rack such that their respective closed rear aprons are adjacent to one another. A series of air intake slots are provided in a front panel disposed in each chassis. Air is exhausted out independently from within each chassis through the respective front panels. The interiors of the chassis are partitioned with pairs of floor-to-ceiling walls that extend back from the respective front panels oppositely toward the closed back aprons, and that provides a bay between them. The airflow through the interiors of each chassis is tested for turbulence and component-cooling effectivity. The rearward extent of the floor-to-ceiling walls is adjusted according to results obtained in the step of testing. Various ones of the series of air intake slots are blocked or unblocked according to results obtained in the step of testing. The placement of components inside the chassis is arranged such that airflow arriving inside from the air intake slots visits, in order: processors, a memory, a hard disk drive, and lastly a power supply before being forced out in the step of exhausting air.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the "true" spirit and scope of the invention.

What is claimed is:

1. A method for cooling an electronic equipment chassis, the method comprising the steps of:

enclosing several constituent electronic components within a chassis having a closed back apron, closed sides, and closed top and bottom panels;

providing a series of air intake slots in a front panel disposed in said chassis;

exhausting air out from within said chassis through said front panel;

partitioning the interior of said chassis with a floor-to-ceiling wall that extends back from said front panel oppositely toward said closed back apron;

testing the airflow through said interior of said chassis for turbulence and component-cooling effective; and adjusting the rearward extent of said floor-to-ceiling wall according to results obtained in the step of testing.

2. A method for cooling an electronic equipment chassis, the method comprising the steps of:

enclosing several constituent electronic components within a chassis having a closed back apron, closed sides, and closed top and bottom panels;

providing a series of air intake slots in a front panel disposed in said chassis;

exhausting air out from within said chassis through said front panel;

partitioning the interior of said chassis with a floor-to-ceiling wall that extends back from said front panel oppositely toward said closed back apron;

testing the airflow through said interior of said chassis for turbulence and component-cooling effectivity; and blocking and unblocking various ones of said series of air intake slots according to results obtained in the step of testing.

3. A method for cooling an electronic equipment chassis, the method comprising the steps of:

enclosing several constituent electronic components within a chassis having a closed back apron, closed sides, and closed top and bottom panels;

providing a series of air intake slots in a front panel disposed in said chassis;

exhausting air out from within said chassis through said front panel;

partitioning the interior of said chassis with a floor-to-ceiling wall that extends back from said front panel oppositely toward said closed back apron; and arranging the placement of components inside said chassis such that airflow arriving inside from said air intake slots visits, in order: processors, memory, a hard disk drive, and lastly a power supply before being forced out in the step of exhausting air.

4. The method of claim 3, further comprising the step of:

partitioning the interior of said chassis with a pair of floor-to-ceiling walls that extend back from said front panel oppositely toward said closed back apron, and that provide a bay between them.

5. A method for cooling an electronic equipment chassis, the method comprising the steps of:

enclosing several constituent electronic components within a chassis having a closed back apron, closed sides, and closed top and bottom panels;

providing a series of air intake slots in a front panel disposed in said chassis;

exhausting air out from within said chassis through said front panel;

partitioning the interior of said chassis with a pair of floor-to-ceiling walls that extend back from said front panel oppositely toward said closed back apron, and that provide a bay between them;

testing the airflow through said interior of said chassis for turbulence and component-cooling effectivity;

adjusting the rearward extent of said floor-to-ceiling walls according to results obtained in the step of testing;

blocking and unblocking various ones of said series of air intake slots according to results obtained in the step of testing;

arranging the placement of components inside said chassis such that airflow arriving inside from said air intake slots visits, in order: processors, memory, a hard disk drive, and lastly a power supply before being forced out in the step of exhausting air.

6. A method for cooling a pair of electronic equipment chassis, the method comprising the steps of:

enclosing respective constituent electronic components within each of a pair of chassis each having a closed back apron, closed sides, and closed top and bottom panels;

arranging said pair of chassis back-to-back in the same vertical space of an equipment rack such that their respective closed rear aprons are adjacent to one another;

providing a series of air intake slots in a front panel disposed in each said chassis;

exhausting air out independently from within each said chassis through said respective front panels;

partitioning the interiors of said chassis with pairs of floor-to-ceiling walls that extend back from said respective front panels oppositely toward said closed back aprons, and that provides a bay between them;

testing the airflow through said interiors of each said chassis for turbulence and component-cooling effectivity;

adjusting the rearward extent of said floor-to-ceiling walls according to results obtained in the step of testing;

blocking and unblocking various ones of said series of air intake slots according to results obtained in the step of testing;

arranging the placement of components inside said chassis such that airflow arriving inside from said air intake slots visits, in order: processors, memory, a hard disk drive, and lastly a power supply before being forced out in the step of exhausting air.

7. A cooling in-the-round system for mounting inside a standard 19" RETMA-rack, comprising:

chassis having a closed back apron, closed sides, and closed top and bottom panels;

a front panel mounted to an open front side of the chassis and providing for forced-air cooling;

a series in intake ports disposed in the front panel to one side;

a fan and exhaust port disposed in the front panel to another opposite side;

a pair of floor-to-ceiling partitions disposed inside the chassis and extending rearward from the front panel between the intake and exhaust ports, and such that internal circulating air is directed back toward said closed back apron; and an arrangement of blockages to the series in intake ports that improves cooling airflow around the ends of the pair of floor-to-ceiling partitions and between the intake and exhaust ports.

8. The system of claim 7, wherein:

the arrangement of blockages to the series in intake ports are experimentally determined to result in optimal cooling of electronic components operating internal to the chassis.

9. The system of claim 7, wherein:

the rearward extent of the pair of floor-to-ceiling partitions is experimentally determined to result in optimal cooling of electronic components operating internal to the chassis.

10. The system of claim 7, further including:

a removable lid for attachment to the top of the chassis;

a ductwork disposed in the lid and providing for the conduction of cool outside air directly to a CPU cooling fan mounted on a microprocessor on a processor board within the chassis.

11. The system of claim 7, wherein:

the ductwork provides for the drawing in of cool air through a portion of the series in intake ports.

* * * * *